(12) United States Patent
Yi

(10) Patent No.: US 8,587,197 B2
(45) Date of Patent: Nov. 19, 2013

(54) MICROPLASMA CURRENT SWITCH

(75) Inventor: Seung-Jun Yi, Gyonggi-do (KR)

(73) Assignee: Hoseo University Academic Cooperation Foundation, Chungcheongnam-do (KR)

( * ) Notice: Subject to any disclaimer, the term of this patent is extended or adjusted under 35 U.S.C. 154(b) by 866 days.

(21) Appl. No.: 12/682,043

(22) PCT Filed: Sep. 26, 2008

(86) PCT No.: PCT/KR2008/005715
§ 371 (c)(1),
(2), (4) Date: Apr. 8, 2010

(87) PCT Pub. No.: WO2009/048232
PCT Pub. Date: Apr. 16, 2009

(65) Prior Publication Data
US 2010/0207923 A1 Aug. 19, 2010

(30) Foreign Application Priority Data
Oct. 9, 2007 (KR) .......................... 10-2007-0101244

(51) Int. Cl.
*H01J 61/00* (2006.01)
*H01L 51/50* (2006.01)
(52) U.S. Cl.
USPC .......................................... 313/581; 313/503

(58) Field of Classification Search
USPC .......................................... 313/582
See application file for complete search history.

(56) References Cited

U.S. PATENT DOCUMENTS 6,781,309 B2 * 8/2004 Choi et al. .................... 313/586
2006/0290643 A1 12/2006 Sakamoto

FOREIGN PATENT DOCUMENTS

| JP | 07-175420 | 7/1995 |
| JP | 11-109890 | 4/1999 |
| JP | 18-330592 | 12/2006 |

\* cited by examiner

*Primary Examiner* — Britt D Hanley
(74) *Attorney, Agent, or Firm* — Larson & Larson, P.A.; Frank Liebenow; Justin P. Miller

(57) ABSTRACT

The present invention relates to a microplasma current switch enabling to increase the amount of electric current passing through the microplasma current switch by adjusting the areas of electrodes exposed to plasmas. The present invention includes a plasma discharge space; a plasma generating means installed within the plasma discharge space; an exposed cathode electrode installed within the plasma discharge space; and an exposed anode electrode installed within the plasma discharge space apart from the exposed cathode electrode, wherein the exposed anode electrode is connected electrically to the exposed cathode electrode by generating a plasma, and the exposed area of the exposed anode electrode to the plasma is smaller than that of the exposed cathode electrode.

12 Claims, 12 Drawing Sheets

RELATED ART

MICROPLASMA CURRENT SWITCH

BACKGROUND

The present invention relates to a microplasma current switch thereof; and, more particularly, to a microplasma current switch thereof enabling to increase the amount of electric current passing through the microplasma current switch by adjusting the areas of electrodes exposed to plasmas and enabling to maximize the area of an electrical device by optimizing the structure of electrodes.

As information telecommunication technologies have been greatly developed, a variety of demands for electronic display devices are highly increased to keep up with the developing information society. And, so do the demands for various displays. In order to satisfy the demands of the information society, for electronic display devices are required characteristics such as high-resolution, large-size, low-cost, high-performance, light-weight, slim-dimension, and the like, for which new flat panel displays (FPDs) are developed as a substitution for conventional cathode ray tubes (CRTs).

The FPDs include LCDs (liquid crystal displays), ELDs (electroluminescent displays), PDPs (plasma display panels), FEDs (field emission displays), VFDs (vacuum fluorescence displays), LEDs (light emitting displays), and the like. Compared with a non-emissive device such as LCDs, ELDs attract attention as a FPD having a response speed faster than that of the non-emissive display, excellent brightness by self-luminescence, easy fabrication thanks to a simple structure, and light-weight/slim-dimension. Thus, the ELDs are widely applied to various fields such as a LCD backlight, mobile terminal, car navigation system (CNS), notebook computer, wall TV, and the like.

Such ELDs are divided into two categories, i.e. organic electroluminescent displays (hereinafter abbreviated OELDs) and inorganic electroluminescent displays (hereinafter abbreviated IELDs) in accordance with materials used for luminescent layers, respectively. IELDs, which emit light using the collisions of electrons accelerated by an high electric field, are classified into AC thin film ELDs, AC thick film ELDs, DC thick film ELDs, and the like in accordance with the film thickness and driving systems. And, OELDs, which emit light by a current flow, are classified into low-molecular OELDs and high-molecular OELDs in accordance with organic materials used for luminescent layers, and the low-molecular OELDs are classified into low-molecular fluorescent OELDs and low-molecular phosphorescent OELDs.

Meanwhile, in order that electrical displays attain high quality such as high-resolution, high-brightness, large-size, and the like, required are active type electrical displays having a switching device in each of pixels. Among various types of switching devices, amorphous silicon or poly-silicon thin film transistors are mainly used for the active type electrical displays. However, the amorphous silicon or poly-silicon thin film transistors have demerits such as a complicated fabrication process and high manufacturing cost. Particularly, in the case of OELDs driven in a current mode, since active type OELDs require more than two thin film transistors as well as more than one capacitor, the structure and fabrication process are complicated. Moreover, since the active type OELDs require high-level fabrication technologies, it is difficult to achieve a high production yield, and the manufacturing cost is high.

FIG. 1 illustrates a schematic bird's-eye view of disassembled upper and lower plates of a plasma switched organic electroluminescent display (hereinafter abbreviated PSOELD) for pixel regions according to a related art. And, FIG. 2 schematically illustrates a cross-sectional view of the assembled upper and lower plates of the PSOELD shown in FIG. 1 along the bisecting lines A-A' and B-B', respectively, in which the upper plate (100) is rotated clockwise by 90 degrees with respect to the lower plate (200) for the convenience of understanding.

The PSOELDs consist of an upper plate (100) and a lower plate (200). The lower plate (200) includes a rear substrate (202), sustain electrodes (204), a dielectric layer (206), barrier ribs (208), and protective layers (210). The upper plate (100) confronting the lower plate (200) includes a front substrate (102), address electrodes (104), anode layers (106), insulating layers (108), electroluminescent layers (110), cathode layers (112), and exposed cathode electrodes (114). And, the cathode layers (112) are used as exposed anode electrodes with respect to the corresponding exposed cathode electrodes (114).

On the rear substrate (202) confronting the front substrate (102), a plurality of the sustain electrodes (204) are formed in parallel with each other like stripes. In this case, every two adjacent sustain electrodes construct a plurality of sustain electrode pairs. One electrode of the sustain electrode pair is separated from the other electrode at an interval of several tens to several hundreds of micrometers and the sustain electrodes (204) are several hundreds of micrometers wide. The dielectric layer (206) restricting a discharge current is formed on the rear substrate (202) including the sustain electrodes (204) at a thickness of several to several tens of micrometers.

A plurality of the barrier ribs (208) are formed on the dielectric layer (206) at a height of several hundreds of micrometers so as to define plasma discharge spaces and prevent a plasma discharge from diffusing into other adjacent cells. In this case, the barrier ribs (208) are formed to provide a lattice structure including a plurality of lattices so that a pair of the sustain electrodes (204) constructing the sustain electrode pair can be placed in specific ones of the corresponding plasma discharge spaces in the same row or column of the lattice structure. And, a plurality of the protective layers (210) are formed at a thickness of sub-micrometer to several micrometers on the exposed surface of the dielectric layer (206) between the barrier ribs (208) by vacuum evaporation using MgO or the like having a high secondary electron emission coefficient to protect the dielectric layer (206) from plasma etching as well as make a plasma discharge occur with ease.

On the front substrate (102) of the upper plate (100), a plurality of the address electrodes (104) and exposed cathode electrodes (114) are formed alternately in parallel with each other like stripes crossing the sustain electrodes (204) of the lower plate (200) at right angles. A plurality of the anode layers (106) are formed like stripes between and in parallel with the address electrodes (104) and exposed cathode electrodes (114) on the front substrate (102), using a transparent conductive material such as ITO (indium tin oxide), IZO (indium zinc oxide), or the like.

In order to increase a contrast ratio by cutting off light from a plasma discharge, a plurality of the insulating layers (108) made of a black insulating material are formed on the front substrate (102) including the address electrodes (104), exposed cathode electrodes (114), and anode layers (106). And, a plurality of through-hole type anode contact holes (116) exposing portions of the anode layers (106) are formed by removing the insulating layers (108) located on the anode layers (106) and exposed cathode electrodes (114).

A plurality of the electroluminescent layers (110) are formed on the insulating layers (108) including the anode contact holes (116). In this case, each of the electroluminescent layers (110) is formed in rectangular shape enough to cover the corresponding anode contact hole (116). And, a plurality of the cathode layers (112) made of a conductive metal such as aluminum or the like are formed on the electroluminescent layers (110) by vacuum evaporation. In this case, the electroluminescent layers (110) are selected from the group consisting of high-molecular organic electroluminescent materials, low-molecular fluorescent organic electroluminescent materials, low-molecular phosphorescent organic electroluminescent materials, and the like.

The upper and lower plates (100) and (200) are aligned, making each of the anode contact holes (116) placed between the corresponding barrier ribs (208) as well as confront the corresponding sustain electrode pair (204). A mixed gas of Ne—Xe or Ne—Xe—Ar is injected into the respective plasma discharge spaces between the barrier ribs (208) at pressures below one atmosphere, thereby enabling to generate plasmas. For instance, a mixed gas of Ne(96%)-Xe(4%) is injected at 500 torr to generate plasmas. When the electroluminescent layers (110) are formed of low-molecular phosphorescent organic electroluminescent materials, the electroluminescent layers (110) are deposited by thermal evaporation using a shadow mask. Both hole injection layers (118) and hole transport layers (120) are further inserted between the anode layers (106) and electroluminescent layers (110). The hole injection layers (118) are formed on the anode layers (106), and the hole transport layers (120) are formed between the hole injection layers (118) and electroluminescent layers (110). And, both hole blocking layers (122) and electron transport layers (124) are further inserted between the electroluminescent layers (110) and cathode layers (112). The hole blocking layers (122) is formed on the electroluminescent layers (110), and the electron transport layers (124) are formed between the hole blocking layers (122) and cathode layers (112).

Unfortunately, the plasma switched organic electroluminescent display according to the related art has the following drawbacks. Because the cathode layers (112), which act as exposed anode electrodes with respect to the exposed cathode electrodes (114), have larger areas exposed to plasmas than the exposed cathode electrodes (114), the amount of electric current becomes small; thus, the operation voltage rises, and the power consumption increases. The maximum electric current capacity is decreased as well. Moreover, owing to the exposed cathode electrodes (114), the areas of the organic electroluminescent devices are decreased structurally, and the aperture ratio is subsequently decreased.

SUMMARY

Accordingly, the present invention is directed to a microplasma current switch that substantially obviates one or more of the problems due to limitations and disadvantages of the related art.

An object of the present invention is to provide a microplasma current switch enabling to increase the amount of electric current passing through the microplasma current switch by adjusting the areas of electrodes exposed to plasmas Another object of the present invention is to provide a microplasma current switch enabling to maximize the area of an electrical device within a cell region by forming an insulating layer between exposed electrodes to plasmas so as to optimize the electrode structure.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention as embodied and broadly described, a microplasma current switch according to the present invention includes a plasma discharge space; a plasma generating means installed within the plasma discharge space; an exposed cathode electrode installed within the plasma discharge space; and an exposed anode electrode installed within the plasma discharge space apart from the exposed cathode electrode, wherein the exposed anode electrode is connected electrically to the exposed cathode electrode by generating a plasma, and an exposed area of the exposed anode electrode to the plasma is smaller than that of the exposed cathode electrode.

Preferably, the microplasma current switch further includes an electrical device connected to the exposed cathode electrode; and a power supply unit installed between the electrical device and the exposed anode electrode, wherein the electrical device contributes to a display.

Preferably, the electrical device further includes a cathode layer of the electrical device connected to a cathode of the power supply unit; an electroluminescent device connected to the cathode layer of the electrical device; and the exposed cathode electrode connected to the electroluminescent device, wherein the exposed cathode is used as an anode layer of the electrical device.

Preferably, the plasma discharge space is defined by assembling a front substrate and a rear substrate along with barrier ribs partitioning a cell region, and the electrical device further includes a cathode layer of the electroluminescent device on the front substrate; an electroluminescent layer on the cathode layer of the electroluminescent device; and an anode layer of the electroluminescent device on the electroluminescent layer, wherein the anode layer of the electroluminescent device is used as the exposed cathode electrode, and the exposed anode electrode is formed on the front substrate apart from the exposed cathode electrode.

Preferably, the electrical device is an organic electroluminescent device.

In another aspect of the present invention, a microplasma current switch includes a plurality of plasma discharge spaces; a plurality of plasma generating means installed within the respective plasma discharge spaces; a plurality of designation means, which have display information, selecting the plasma discharge spaces; a plurality of exposed cathode electrodes installed within the respective plasma discharge spaces; and a plurality of exposed anode electrodes installed within the respective plasma discharge spaces apart from the corresponding exposed cathode electrodes, wherein the exposed anode electrodes are connected electrically to the corresponding exposed cathode electrodes by generating plasmas and exposed areas of the exposed anode electrodes to the plasmas are smaller than those of the exposed cathode electrodes.

Preferably, the plasma discharge spaces are defined by assembling a front substrate and a rear substrate along with a plurality of barrier ribs partitioning a plurality of cell regions, and a plurality of electrical devices are installed within the respective cell regions, wherein each of the electrical devices includes a cathode layer of an electroluminescent device on the front substrate; an electroluminescent layer on the cathode layer of the electroluminescent device; and an anode layer of the electroluminescent device on the electroluminescent layer, wherein the anode layer of the electroluminescent device is used as the exposed cathode electrode, and the exposed anode electrodes are formed on the front substrate apart from the corresponding exposed cathode electrodes.

Preferably, the designation means further include a plurality of address electrodes installed on the rear substrate in parallel with each other; and a plurality of sustain electrodes constructing a plurality of sustain electrode pairs, wherein the sustain electrodes are insulated from the address electrodes and cross the address electrodes at right angles.

In a further aspect of the present invention, a microplasma current switch includes a plasma discharge space; a plasma generating means installed within the plasma discharge space; a first exposed electrode installed within the plasma discharge space; an insulating layer installed on the first exposed electrode making a portion of the first exposed electrode exposed at a first area; and a second exposed electrode installed on the insulating layer and exposed at a second area, wherein the second exposed electrode is connected electrically to the first exposed electrode by generating a plasma.

Preferably, the microplasma current switch further includes an electrical device connected to the first exposed electrode; and a power supply unit installed between the electrical device and the second exposed electrode, wherein the electrical device contributes to a display.

Preferably, the electrical device further includes an anode layer of the electrical device connected to an anode of the power supply unit; an electroluminescent device connected to the anode layer of the electrical device; and the first exposed electrode connected to the electroluminescent device, wherein the first exposed electrode is used as a cathode layer of the electrical device.

Preferably, the plasma discharge space is defined by assembling a front substrate and a rear substrate along with barrier ribs partitioning a cell region, and the electrical device further includes an anode layer of the electroluminescent device on the front substrate; an electroluminescent layer on the anode layer of the electroluminescent device; a cathode layer of the electroluminescent device on the electroluminescent layer; the insulating layer formed on the anode layer of the electroluminescent device including the electroluminescent layer and the cathode layer of the electroluminescent device so as to expose a portion of the cathode layer of the electroluminescent device at the first area; and the second exposed electrode formed on the insulating layer, wherein the second exposed electrode is exposed at the second area larger than the first area, and the cathode layer of the electroluminescent device is used as the first exposed electrode.

Preferably, the plasma discharge space is defined by assembling a front substrate and a rear substrate along with barrier ribs partitioning a cell region, and the electrical device further includes a cathode layer of the electroluminescent device on the front substrate; an electroluminescent layer on the cathode layer of the electroluminescent device; an anode layer of the electroluminescent device on the electroluminescent layer; the insulating layer formed on the cathode layer of the electroluminescent device including the electroluminescent layer and the anode layer of the electroluminescent device so as to expose a portion of the anode layer of the electroluminescent device at the first area; and the second exposed electrode formed on the insulating layer, wherein the second exposed electrode is exposed at the second area smaller than the first area, and the anode layer of the electroluminescent device is used as the first exposed electrode.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
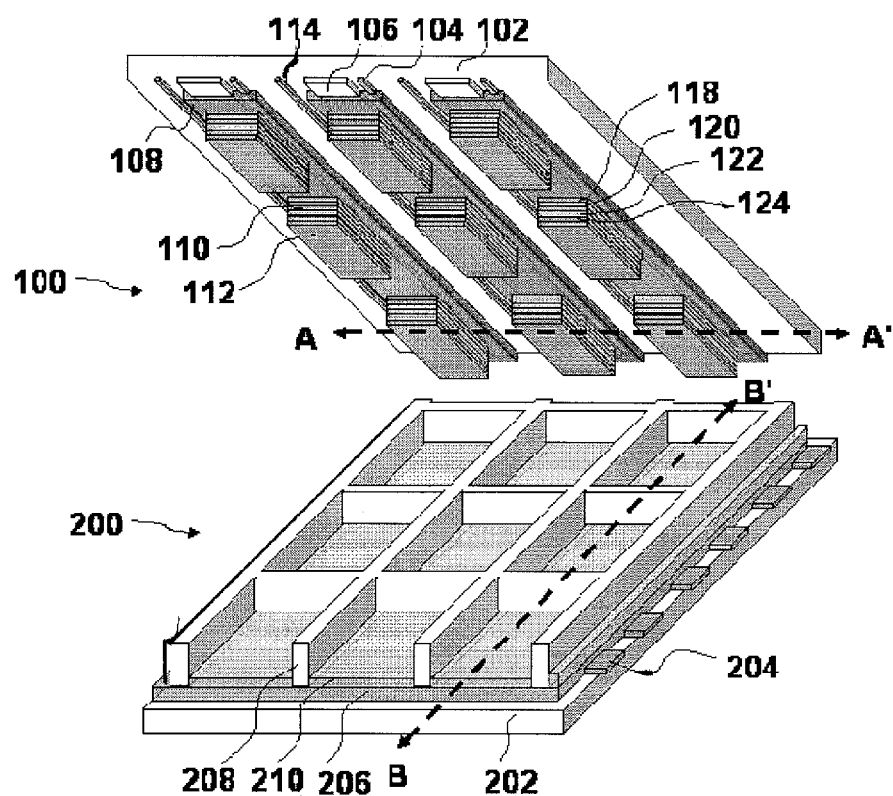
FIG. 1 illustrates a schematic bird's-eye view of disassembled upper and lower plates of a PSOELD according to a related art.
Figure 2:
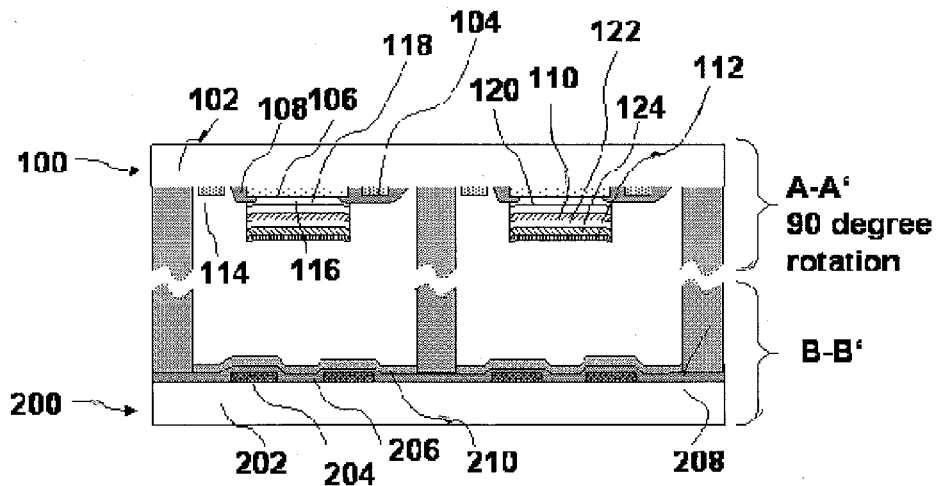
FIG. 2 schematically illustrates a cross-sectional view of the assembled upper and lower plates of the PSOELD shown in FIG. 1 along the bisecting lines A-A' and B-B', respectively.

Reference will now be made in detail to the preferred embodiments of the present invention, examples of which are illustrated in the accompanying drawings. Where possible, the same reference numerals will be used to illustrate like elements throughout the specification. And, detailed component materials and techniques of the embodiments of the present invention include all those used for the related art.

Hereinafter, a microplasma current switch and a fabrication method thereof in accordance with a first preferred embodiment of the present invention will be described in detail with reference to FIGS. 3 to 7.

Figure 3:
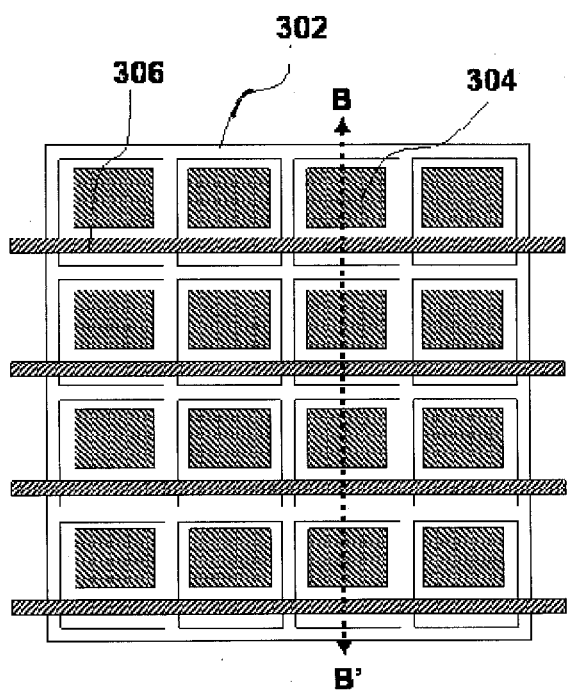
FIG. 3 illustrates a schematic plane view of an upper plate of a microplasma current switch according to a first embodiment of the present invention.
Figure 4:
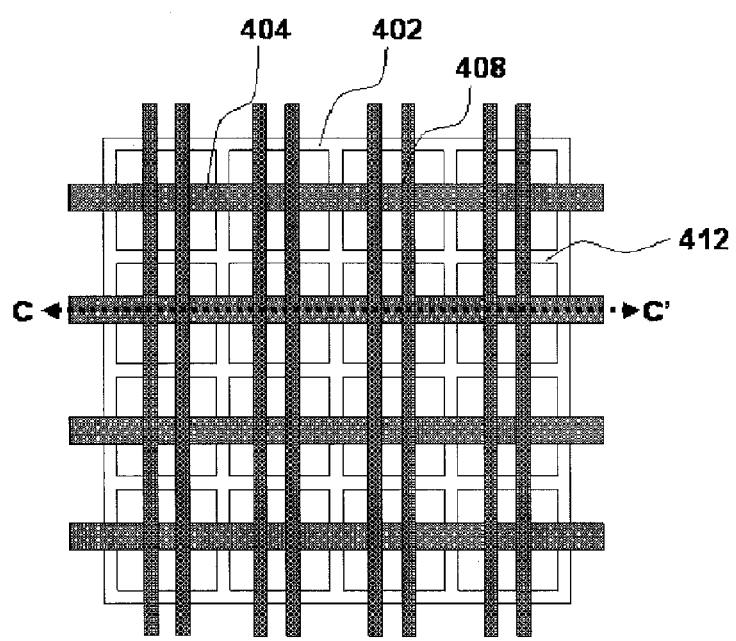
FIG. 4 illustrates a schematic plane view of a lower plate of the microplasma current switch according to the first embodiment of the present invention.
Figure 5:
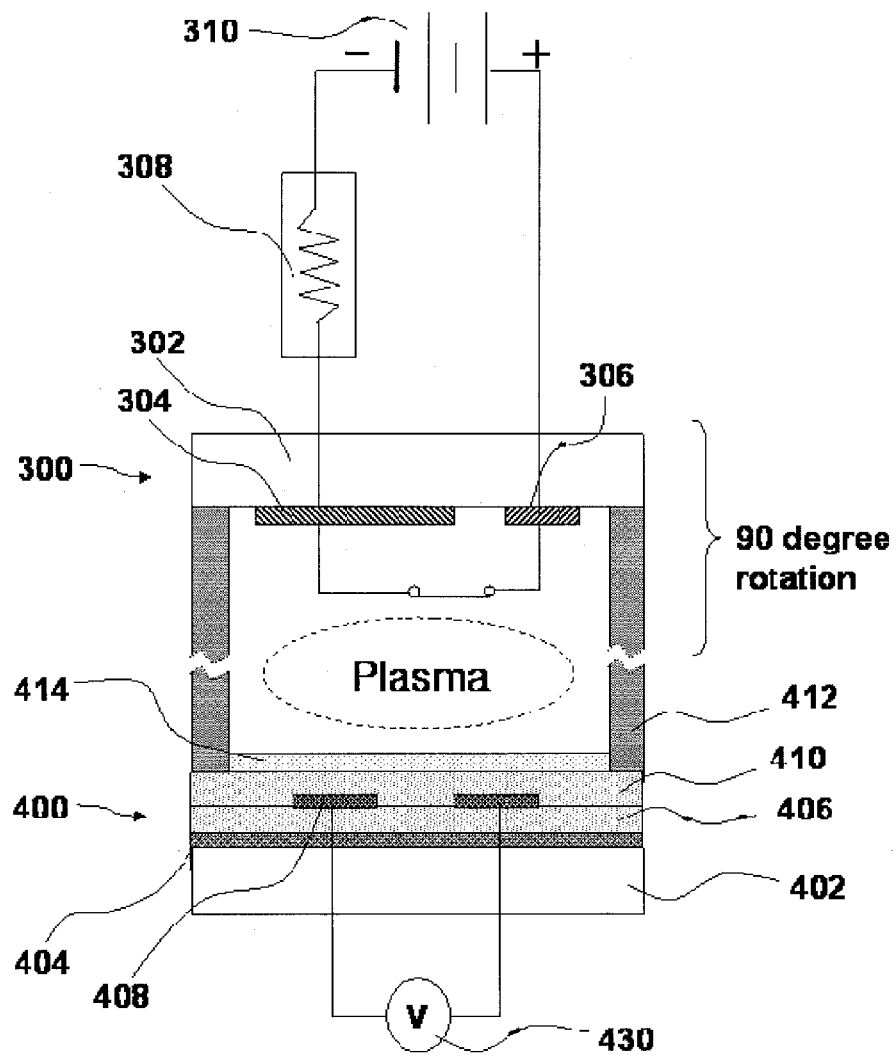
FIG. 5 schematically illustrates a cross-sectional view of the assembled upper and lower plates of the microplasma current switch according to the first embodiment of the present invention.
Figure 6:
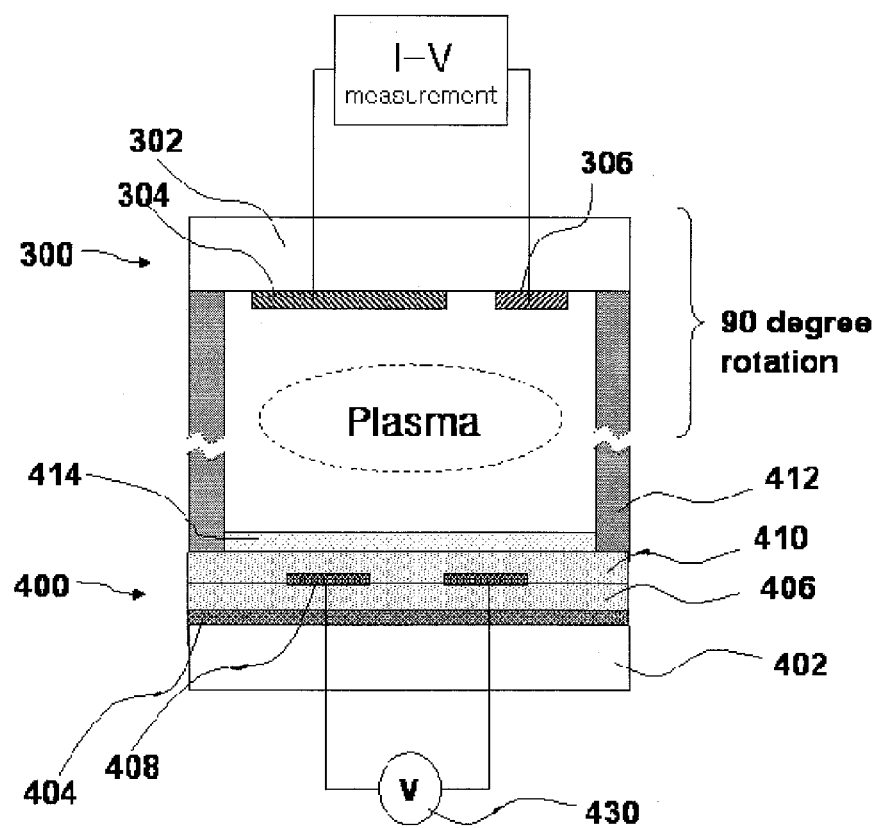
FIG. 6 schematically illustrates a diagram for current versus voltage measurements according to the first embodiment of the present invention.
Figure 7:
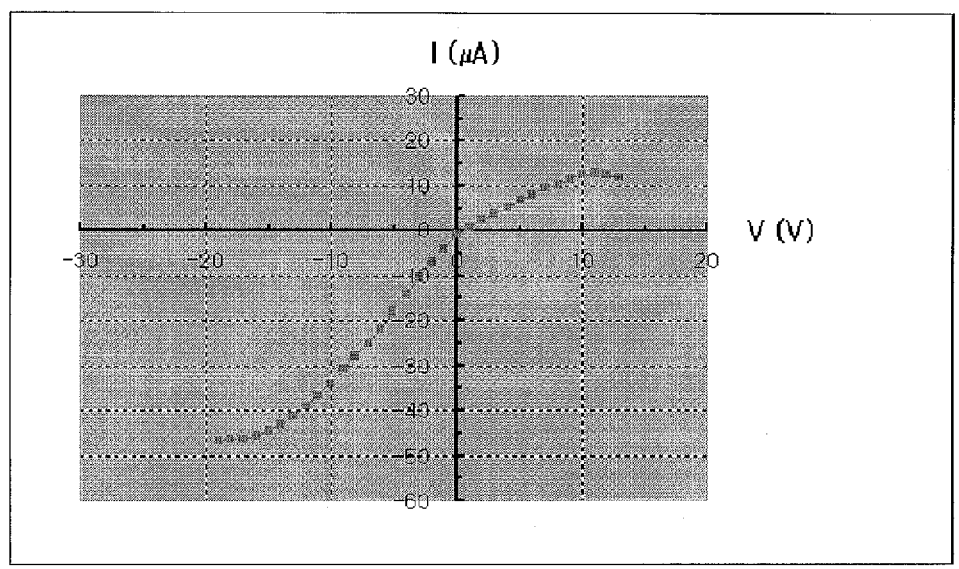
FIG. 7 illustrates a measured current-voltage characteristic according to the first embodiment of the present invention.

FIG. 3 illustrates a schematic plane view of an upper plate of the microplasma current switch according to the first embodiment of the present invention. FIG. 4 illustrates a schematic plane view of a lower plate of the microplasma current switch according to the first embodiment of the present invention. FIG. 5 schematically illustrates a cross-sectional view of the assembled upper and lower plates of the microplasma current switch according to the first embodiment of the present invention. FIG. 6 schematically illustrates a diagram for current versus voltage measurements according to the first embodiment of the present invention. And, FIG. 7 illustrates a measured current-voltage characteristic according to the first embodiment of the present invention.

FIGS. 5 and 6 show only one cell of the microplasma current switch, which are taken along the bisecting lines B-B' and C-C' in FIGS. 3 and 4, respectively, and in which the upper plate (300) is rotated clockwise by 90 degrees with respect to the lower plate (400) for the convenience of understanding.

The microplasma current switch according to the first embodiment of the present invention includes an upper plate (300) and a lower plate (400). The lower plate (400) includes a rear substrate (402), address electrodes (404) on the rear substrate (402), a first dielectric layer (406) on the rear substrate (402) including the address electrodes (404), sustain electrodes (408) on the first dielectric layer (406) wherein two adjacent sustain electrodes construct a sustain electrode pair, an alternating current power supply (430) connected to the sustain electrodes (408), a second dielectric layer (410) on the first dielectric layer (406) including the sustain electrodes (408), barrier ribs (412) on the second dielectric layer (410), and protective layers (414) on the exposed surface of the second dielectric layer (410) between the barrier ribs (412).

And, the upper plate (300) confronting the lower plate (400) includes a front substrate (302), and exposed cathode electrodes (304) as well as exposed anode electrodes (306) on the front substrate (302). Furthermore, the upper plate (300) can include electrical devices (308) connected to the exposed cathode electrodes (304). The electrical devices (308) connected to the exposed cathode electrodes (304) are connected to a cathode of a power supply unit (310), and an anode of the power supply unit (310) is connected to the exposed anode electrodes (306). Electrical devices contributing to a display, such as an organic electroluminescent device or the like, can be used as the electrical devices (308). Even though the process steps of fabricating the microplasma current switch including the upper and lower plates (300) and (400) according to the first embodiment of the present invention are not illustrated in the drawing, the microplasma current switch is fabricated by the following process steps.

In the first process step of fabricating the lower plate (400), a plurality of the address electrodes (404) are formed on the rear substrate (402) in parallel to each other like stripes. In the second process step thereof, the first dielectric layer (406) is formed on the rear substrate (402) including the address electrodes (404). In the third process step thereof, a plurality of the sustain electrodes (408) are formed on the first dielectric layer (406) in parallel with each other like stripes crossing the address electrodes (404) at right angles. In this case, every two adjacent sustain electrodes construct a plurality of sustain electrode pairs. One electrode of the sustain electrode pair is separated from the other electrode at an interval of several tens to several hundreds of micrometers and the sustain electrodes (408) are several hundreds of micrometers wide.

In the forth process step thereof, the second dielectric layer (410) restricting a discharge current is formed on the rear substrate (402) including the sustain electrodes (408) at a thickness of several to several tens of micrometers. In the fifth process step thereof, a plurality of the barrier ribs (412) are formed on the second dielectric layer (410) at a height of several hundreds of micrometers so as to define cell regions, limit plasma discharge spaces, and prevent a plasma discharge from diffusing into other adjacent cells. In this case, the barrier ribs (412) are formed to provide a lattice structure including a plurality of lattices so that a pair of the sustain electrodes (408) constructing the sustain electrode pair can be placed in specific ones of the corresponding plasma discharge spaces in the same row or column of the lattice structure. In the sixth process step thereof, a plurality of the protective layers (414) are deposited at a thickness of sub-micrometer to several micrometers on the exposed surface of the second dielectric layer (410) between the barrier ribs (412) by e-beam evaporation using MgO or the like having a high secondary electron emission coefficient to protect the second dielectric layer (410) from plasma etching as well as make a plasma discharge occur with ease.

In the first process step of fabricating the upper plate (300), on the front substrate (302), a plurality of the exposed anode electrodes (306) are formed in parallel with each other like stripes crossing the sustain electrodes (408) of the rear substrate (402) at right angles, and a plurality of the exposed cathode electrodes (304) are formed in rectangular shape between and apart from the exposed anode electrodes (306). In this case, the areas of the exposed cathode electrodes (304) are larger than those of the exposed anode electrodes (306). And, the electrical devices (308) contributing to a display, such as an organic electroluminescent device or the like, can be installed between the exposed cathode electrodes (304) and power supply unit (310).

Sealants are dispensed on the edges of the rear and front substrates (402) and (302), the upper and lower plates (300) and (400) are aligned and assembled, gases existing between the rear and front substrates (402) and (302) are exhausted, and a gas for generating plasmas is injected so as to finish fabricating the microplasma current switch.

On the front substrate (302), the exposed cathode electrodes (304) are formed at areas larger than the exposed anode electrodes (306), and connected electrically to the exposed anode electrodes (306) through plasmas. And, the cathode of the power supply unit (310) is connected to the electrical devices (308) connected to the exposed cathode electrodes (304), and the anode of the power supply unit (310) is connected to the exposed anode electrodes (306).

Explained in the following is an operating process of the microplasma current switch in accordance with the first embodiment of the present invention. The operating process mainly includes a total white and erase period carrying out a whole surface discharge and a whole surface erase, an address period bringing about a plasma discharge selectively in accordance with display data, and a sustain period carrying out a sustain discharge in the cells discharged during the address period.

The total white and erase period includes an erase step of discharging a whole surface of cell regions and removing generated wall charges. In order to discharge the whole surface of the cell regions, an initializing voltage of 150 V~300 V is applied between every two electrodes of the sustain electrode pairs. In the plasma discharge space where a plasma discharge is generated, wall charges and charged particles exist. The total white and erase period is completed by applying an erase voltage to the sustain electrodes (408) enough not to generate a plasma discharge so as to remove the wall charges and charged particles. Using the same voltage as the initializing voltage, the erase voltage may be applied thereto for a short period of time enough not to generate a plasma discharge.

The address period is carried out by applying a positive address pulse to the address electrodes (404) in order and by applying a negative scan pulse synchronized with the address pulse to one electrode of the sustain electrode pair selectively in accordance with display data. The scan pulse is applied to cells having the display data only, but fails to be applied to cells having no display data. As a result, the plasma discharge is generated in the cells to which the address and scan pulses are applied simultaneously. Hence, wall charges are accumulated in the discharged cells.

The sustain period generates a plurality of sustain discharges several times to several tens of times in the cells, where the wall charges are accumulated, by applying sustain discharge pulses to every two electrodes of the sustain electrode pairs alternately. In this case, the amount of electric charge flowing through the microplasma current switch is controlled by the number of times of the sustain discharges. The sustain discharge pulse should include a discharge voltage and a discharge period so that the sustain discharge occurs in the cells selected during the address period, and vice versa.

Referring to FIG. 6, a current-voltage measurement unit is installed between the exposed cathode electrode (304) and exposed anode electrode (306) so as to measure current-voltage characteristics as the voltage of the exposed cathode electrode (304) is varied in respect to the exposed anode electrode (306). As shown in FIG. 7, the amount of saturation current as well as electric current is increased when negative voltages are applied to the exposed cathode electrode (304) having a larger area than the exposed anode electrode (306).

The area of the cell, from which the current-voltage curve in FIG. 7 was obtained, was 1000 μm×1000 μm, and the areas of the exposed anode electrode (306) and exposed cathode electrode (304) were 270 μm×1000 μm and 510 μm×1000 μm, respectively. And, the separating interval between the exposed anode electrode (306) and exposed cathode electrode (304) was 60 μm. Using silver paste, the exposed anode electrode (306) and exposed cathode electrode (304) were formed by a screen printing method.

The address electrode (404) was 80 μm wide and formed by a screen printing method using silver paste. The first dielectric layer (406) was 30 μm thick and formed by a screen printing method using glass paste. The sustain electrodes (408) were 270 μm wide and formed by a screen printing method using silver paste. The separating interval between two electrodes of the sustain electrode pair was 60 μm. The second dielectric layer (410) was 30 μm thick and formed by a screen printing method using glass paste. The barrier ribs (412) were 120 μm high and formed by a screen printing method using glass paste. The protective layer (414) was 0.5 μm thick and formed of MgO by e-beam evaporation.

The upper and lower plates (300) and (400) were aligned and assembled. And, a mixed gas of Xe (15%), He (50%) and Ne (35%) was injected at 350 torr after gases existing between the rear and front substrates (402) and (302) were exhausted to 3×10−6 torr. An alternating voltage of 260 V (70 V∼−190 V), 2 μs duration and 100% duty ratio was applied to the sustain electrodes (408) in order to generate plasmas, and the current-voltage characteristic was measured.

Figure 8:
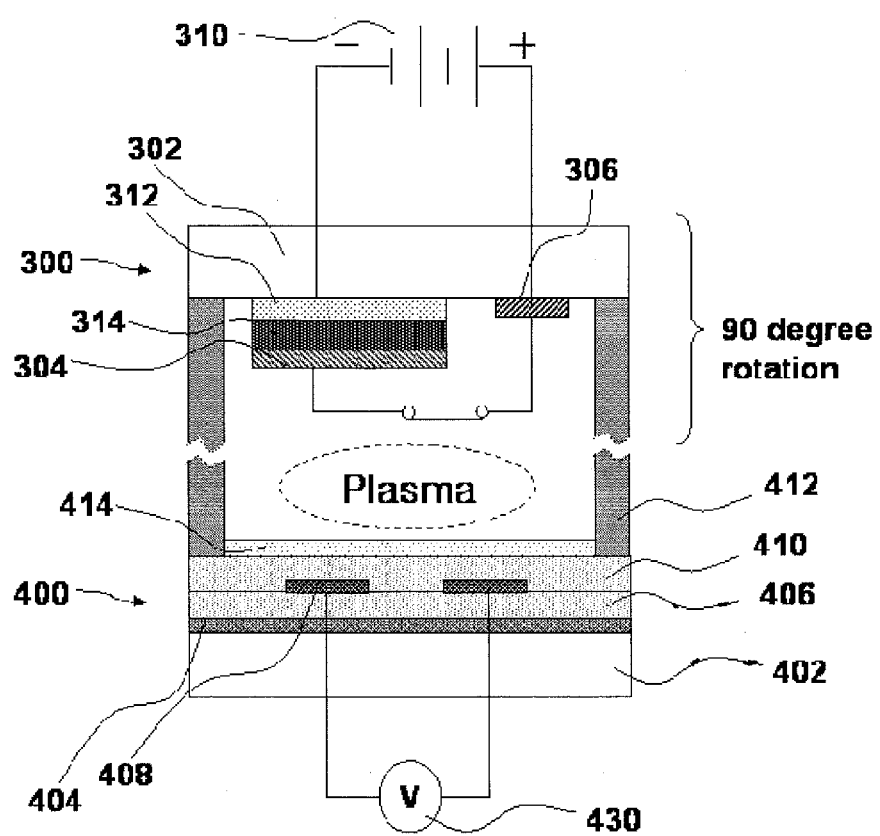
FIG. 8 schematically illustrates a cross-sectional view of a microplasma current switch according to a second embodiment of the present invention.

FIG. 8 schematically illustrates a cross-sectional view of a microplasma current switch according to a second preferred embodiment of the present invention.

FIG. 8 shows only one cell of a display device using the microplasma current switch, wherein the upper plate (300) is rotated clockwise by 90 degrees with respect to the lower plate (400) for the convenience of understanding.

The microplasma current switch according to the second embodiment of the present invention includes an upper plate (300) and a lower plate (400). The lower plate (400) includes a rear substrate (402), address electrodes (404) on the rear substrate (402), a first dielectric layer (406) on the rear substrate (402) including the address electrodes (404), sustain electrodes (408) on the first dielectric layer (406) wherein two adjacent sustain electrodes construct a sustain electrode pair, an alternating current power supply (430) connected to the sustain electrodes (408), a second dielectric layer (410) on the first dielectric layer (406) including the sustain electrodes (408), barrier ribs (412) on the second dielectric layer (410), and protective layers (414) on the exposed surface of the second dielectric layer (410) between the barrier ribs (412).

And, the upper plate (300) confronting the lower plate (400) includes a front substrate (302), cathode layers of electroluminescent devices (312) on the front substrate (302), electroluminescent layers (314) made of organic materials on the cathode layers of electroluminescent devices (312), exposed cathode electrodes (304), which are used as both anode layers of the electroluminescent devices and cathode electrodes of the microplasma current switches, formed on the electroluminescent layers (314), and exposed anode electrodes (306), which are used as anode electrodes of the microplasma current switches, formed on the front substrate (302) apart from the cathode layers of electroluminescent devices (312).

Even though the process steps of fabricating the microplasma current switch including the upper and lower plates (300) and (400) according to the second embodiment of the present invention are not illustrated in the drawing, the microplasma current switch is fabricated by the following process steps. Since the process Steps of fabricating the lower plate (400) and assembling the upper and lower plates (300) and (400) of the second embodiment of the present invention are identical to those of the first embodiment of the present invention, the explanation thereof is omitted.

In the first process step of fabricating the upper plate (300), a first ITO (indium tin oxide) layer is deposited on the front substrate (302) at a thickness of about 1000 Å by a sputtering method, and an Al (aluminum) layer is deposited on the first ITO layer at a thickness of 30 Å to 50 Å in order to form a plurality of the cathode layers of electroluminescent devices (312) and a plurality of the exposed anode electrodes (306) used as the anode electrodes of the microplasma current switches when plasmas are generated. In this case, the Al layer on the first ITO layer is needed to reduce the work function difference between the first ITO layer and an electron transport layer formed later. In the second process step thereof, a photoresist is coated on the Al layer, exposed, developed, and the Al and ITO layers are etched, thereby forming the cathode layers of electroluminescent devices (312) and exposed anode electrodes (306) in parallel with each other like stripes crossing the sustain electrodes (408) of the rear substrate (402) at right angles. In this case, the cathode layers of electroluminescent devices (312) are formed wider than the exposed anode electrodes (306).

In the third process step thereof, when the electroluminescent layers (314) are formed of low-molecular organic materials, formed in order by thermal evaporation using shadow masks are a plurality of electron transport layers on the cathode layers of electroluminescent devices (312), a plurality of the electroluminescent layers (314) on the electron transport layers, a plurality of hole transport layers on the electroluminescent layers (314), and a plurality of hole injection layers on the hole transport layers. When the electroluminescent layers (314) are formed of high-molecular organic materials, formed in order by ink-jet printing are a plurality of the electroluminescent layers (314) on the cathode layers of electroluminescent devices (312), and a plurality of hole transport layers on the electroluminescent layers (314).

In the forth process step thereof, deposited are a second ITO layer at a thickness of 500 Å and a Cr (chrome) layer at a thickness of 1000 Å on the second ITO layer at temperatures below 130° C. by a sputtering method using a shadow mask, thereby forming a plurality of the exposed cathode electrodes (304) which are composed of the second ITO and Cr layers, and used as both the anode layers of the electroluminescent devices and the cathode electrodes of the microplasma current switches. In this case, the second ITO layer is formed to reduce the work function difference between the Cr layer and hole injection layer located under the exposed cathode electrodes (304). And, the exposed cathode electrodes (304) are floating electrodes not directly connected to a power supply unit (310), and are connected electrically to the exposed anode electrodes (306) by generating plasmas within cell regions.

In the fifth process step thereof, even if not illustrated in FIG. 8, in order to protect the electroluminescent devices, a silicon nitride layer functioning as a protective layer is deposited at temperatures below 130° C. by a PECVD (plasma enhanced chemical vapor deposition) method on the front substrate (302) including the exposed cathode electrodes and exposed anode electrodes (304) and (306), and the process steps of photoresist coating, exposure, development and etching are carried out so as to expose portions of the exposed cathode electrodes and exposed anode electrodes (304) and (306). In this case, the exposed areas of the exposed cathode electrodes (304) are larger than those of the exposed anode electrodes (306).

In FIG. 8, the cathode layers of electroluminescent devices (312) and electroluminescent layers (314) are installed as the electrical devices (308) in FIG. 5. And, a power supply unit (310) is installed between the cathode layers of electroluminescent devices (312) and exposed anode electrodes (306). On the front substrate (302), the exposed areas of the exposed cathode electrodes (304) are larger than those of the exposed anode electrodes (306), and when the exposed cathode electrodes and exposed anode electrodes (304) and (306) are switched on by plasmas, electric currents flow, thereby emitting light. Moreover, compared with the case that the exposed areas of the exposed cathode electrodes (304) are smaller than those of the exposed anode electrodes (306), the operation voltage and power consumption are decreased.

Hereinafter, a microplasma current switch and a fabrication method thereof in accordance with a third preferred embodiment of the present invention will be described in detail with reference to FIGS. 9 to 11.

Figure 9:
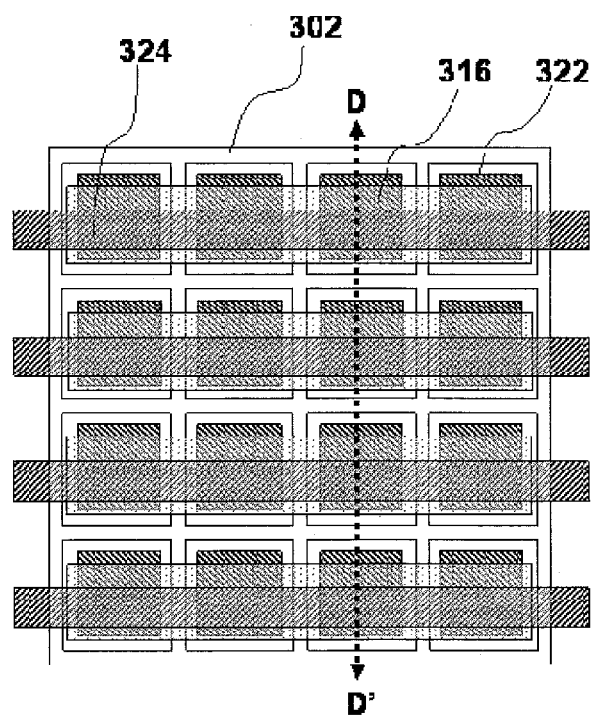
FIG. 9 illustrates a schematic plane view of an upper plate of a microplasma current switch according to a third embodiment of the present invention.
Figure 10:
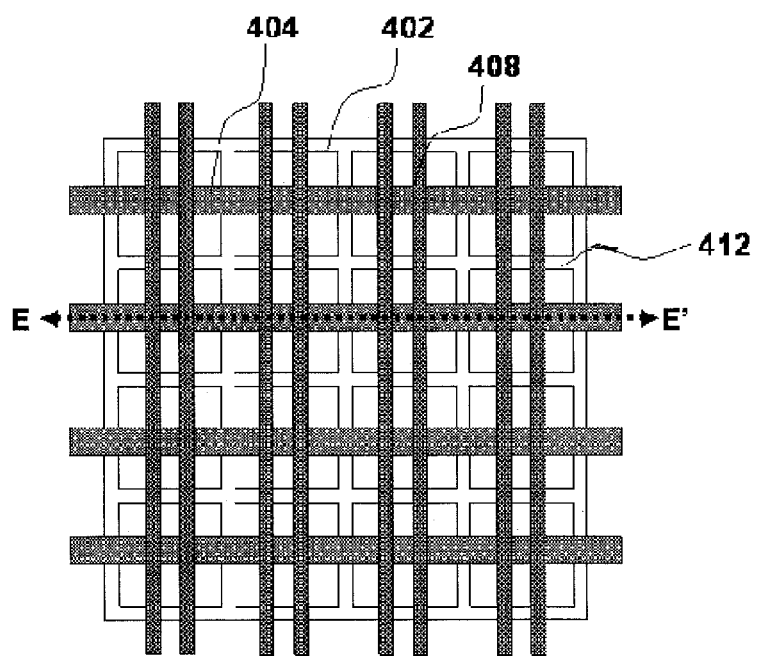
FIG. 10 illustrates a schematic plane view of a lower plate of the microplasma current switch according to the third embodiment of the present invention.
Figure 11:
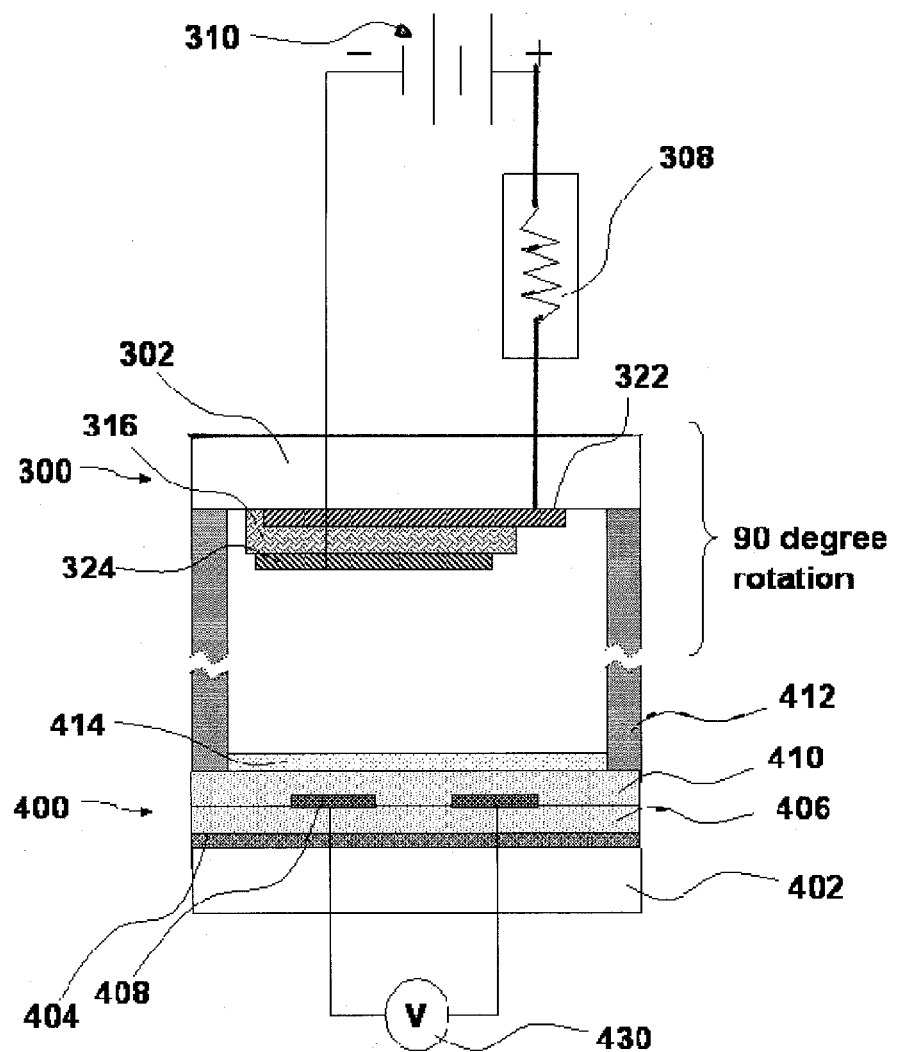
FIG. 11 schematically illustrates a cross-sectional view of the assembled upper and lower plates of the microplasma current switch according to the third embodiment of the present invention.

FIG. 9 illustrates a schematic plane view of an upper plate of the microplasma current switch according to the third embodiment of the present invention, FIG. 10 illustrates a schematic plane view of a lower plate of the microplasma current switch according to the third embodiment of the present invention, and FIG. 11 schematically illustrates a cross-sectional view of the assembled upper and lower plates of the microplasma current switch according to the third embodiment of the present invention. FIG. 11 shows only one cell of the microplasma current switch, which are taken along the bisecting lines D-D' and E-E' in FIGS. 9 and 10, respectively, and in which the upper plate (300) is rotated clockwise by 90 degrees with respect to the lower plate (400) for the convenience of understanding.

The microplasma current switch according to the third embodiment of the present invention includes an upper plate (300) and a lower plate (400). The lower plate (400) includes a rear substrate (402), address electrodes (404) on the rear substrate (402), a first dielectric layer (406) on the rear substrate (402) including the address electrodes (404), sustain electrodes (408) on the first dielectric layer (406) wherein two adjacent sustain electrodes construct a sustain electrode pair, an alternating current power supply (430) connected to the sustain electrodes (408), a second dielectric layer (410) on the first dielectric layer (406) including the sustain electrodes (408), barrier ribs (412) on the second dielectric layer (410), and protective layers (414) on the exposed surface of the second dielectric layer (410) between the barrier ribs (412).

And, the upper plate (300) confronting the lower plate (400) includes a front substrate (302), exposed anode electrodes (322) formed of a conductive metal layer in rectangular shape on the front substrate (302), insulating layers (316) formed on the front substrate (302) including the exposed anode electrodes (322) so as to expose portions of the exposed anode electrodes (322), and exposed cathode electrodes (324) on the insulating layers (316). Furthermore, the upper plate (300) can include electrical devices (308) connected to the exposed anode electrodes (322). The electrical devices (308) connected to the exposed anode electrodes (322) are connected to an anode of a power supply unit (310), and a cathode of the power supply unit (310) is connected to the exposed cathode electrodes (324). Electrical devices contributing to a display, such as an organic electroluminescent device or the like, can be used as the electrical devices (308).

On the front substrate (302), the exposed areas of the exposed anode electrodes (322), which are exposed partially by the insulating layers (316), are smaller than those of the exposed cathode electrodes (324), and when the exposed cathode electrodes and exposed anode electrodes (324) and (322) are switched on by plasmas, electric currents flow, thereby driving the electrical devices (308). And, the exposed areas of the exposed anode electrodes (322) can also be identical to those of the exposed cathode electrodes (324).

Even though the process steps of fabricating the microplasma current switch including the upper and lower plates (300) and (400) according to the third embodiment of the present invention are not illustrated in the drawing, the microplasma current switch is fabricated by the following process steps. Since the process Steps of fabricating the lower plate (400) and assembling the upper and lower plates (300) and (400) of the third embodiment of the present invention are identical to those of the first embodiment of the present invention, the explanation thereof is omitted.

In the first process step of fabricating the upper plate (300), an Al (aluminum) layer is deposited on the front substrate (302) at a thickness of about 1000 Å by a sputtering method in order to form a plurality of the exposed anode electrodes (322) in rectangular shape. A photoresist is coated on the Al layer, exposed, and developed, thereby forming a photoresist pattern. The Al layer is etched by using the photoresist pattern as a mask, thereby patterning the exposed anode electrodes (322). In the second process step thereof, a silicon nitride layer functioning as an insulating layer is deposited at temperatures below 130° C. by a PECVD (plasma enhanced chemical vapor deposition) method on the front substrate (302) including the exposed anode electrodes (322).

In the third process step thereof, an Al layer is deposited on the silicon nitride layer at a thickness of about 1000 Å by e-beam evaporation. A photoresist is coated on the Al layer, exposed, and developed, thereby forming a photoresist pattern. The Al layer is etched by using the photoresist pattern as a mask, thereby patterning a plurality of the exposed cathode electrodes (324) in parallel with each other like stripes crossing the sustain electrodes (408) of the rear substrate (402) at right angles. Continuously, portions of the silicon nitride are etched, whereby portions of the exposed anode electrodes (322) are exposed. The exposed areas of the exposed anode electrodes (322), which are exposed partially by etching the silicon nitride layer, are smaller than those of the exposed cathode electrodes (324). And, the electrical devices (308) contributing to a display, such as an organic electroluminescent device or the like, can be installed between the exposed cathode electrodes (324) and power supply unit (310).

Figure 12:
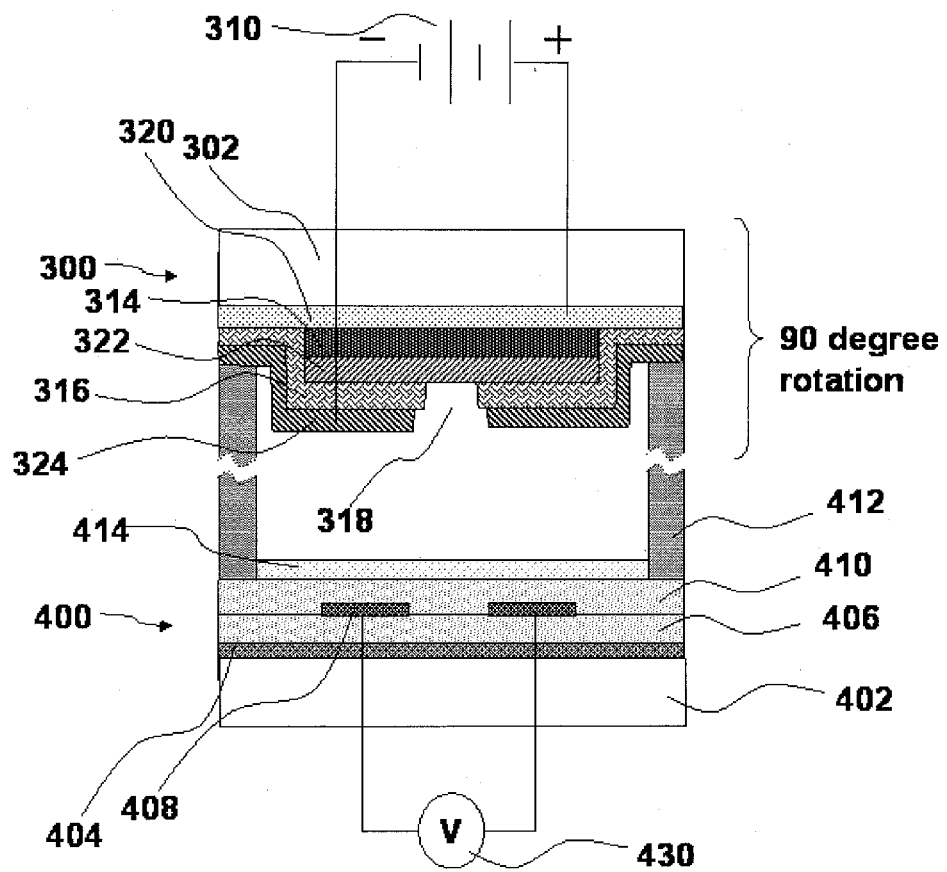
FIG. 12 schematically illustrates a cross-sectional view of a microplasma current switch according to a forth embodiment of the present invention.

FIG. 12 schematically illustrates a cross-sectional view of a microplasma current switch according to a forth preferred embodiment of the present invention. FIG. 12 shows only one cell of a display device using the microplasma current switch, wherein the upper plate (300) is rotated clockwise by 90 degrees with respect to the lower plate (400) for the convenience of understanding.

The microplasma current switch according to the forth embodiment of the present invention includes an upper plate (300) and a lower plate (400). The lower plate (400) includes a rear substrate (402), address electrodes (404) on the rear substrate (402), a first dielectric layer (406) on the rear substrate (402) including the address electrodes (404), sustain electrodes (408) on the first dielectric layer (406), a second dielectric layer (410) on the first dielectric layer (406) including the sustain electrodes (408), barrier ribs (412) on the second dielectric layer (410), and protective layers (414) on the exposed surface of the second dielectric layer (410) between the barrier ribs (412).

And, the upper plate (300) confronting the lower plate (400) includes a front substrate (302), an anode layer of electroluminescent devices (320) on the front substrate (302), electroluminescent layers (314) on the anode layer of electroluminescent devices (320), exposed anode electrodes (322), which are used as cathode layers of the electroluminescent devices, formed on the electroluminescent layers (314), an insulating layer (316) on the anode layer of electroluminescent devices (320) including the electroluminescent layers (314) and exposed anode electrodes (322), an exposed cathode electrode (324) on the insulating layer (316), and exposing openings (318) formed by removing portions of the insulating layer (316) and exposed cathode electrode (324) so as to expose portions of the exposed anode electrodes (322).

And, a power supply unit (310) is installed between the exposed cathode electrode (324) and anode layer of electroluminescent devices (320), and a cathode and anode of the power supply unit (310) are connected to the exposed cathode electrode (324) and anode layer of electroluminescent devices (320), respectively.

On the front substrate (302), the exposed areas of the exposed anode electrodes (322), which are exposed by the exposing openings (318), are smaller than those of the exposed cathode electrode (324) within cell regions, whereby the operation voltage and power consumption are decreased when the exposed cathode electrode and exposed anode electrodes (324) and (322) are connected electrically by plasmas. And, the exposed areas of the exposed anode electrodes (322) can also be identical to those of the exposed cathode electrode (324). Furthermore, since the aperture ratio of the electroluminescent devices is increased, the operation voltage and power consumption are decreased as well as the life time is increased.

Even though the process steps of fabricating the microplasma current switch including the upper and lower plates (300) and (400) according to the forth embodiment of the present invention are not illustrated in the drawing, the microplasma current switch is fabricated by the following process steps. Since the process Steps of fabricating the lower plate (400) and assembling the upper and lower plates (300) and (400) of the forth embodiment of the present invention are identical to those of the first embodiment of the present invention, the explanation thereof is omitted.

In the first process step of fabricating the upper plate (300), an ITO (indium tin oxide) layer is deposited on an entire surface of the front substrate (302) at a thickness of about 1000 Å by a sputtering method, thereby forming the anode layer of electroluminescent devices (320). In the second process step thereof, formed in order by thermal evaporation using shadow masks are a plurality of hole injection layers on the ITO layer, a plurality of hole transport layers on the hole injection layers, a plurality of the electroluminescent layers (314) on the hole transport layers, and a plurality of electron transport layers on the electroluminescent layers (314). When the electroluminescent layers (314) are formed of high-molecular organic materials, formed in order by ink-jet printing are a plurality of hole transport layers on the anode layer of electroluminescent devices (320), and a plurality of the electroluminescent layers (314) on the hole transport layers.

In the third process step thereof, a plurality of first Al (aluminum) layers are deposited on the electron transport layers at a thickness of 1000 Å by e-beam evaporation using a shadow mask, thereby forming a plurality of the exposed anode electrodes (322) used as the cathode layers of the electroluminescent devices. And, the exposed anode electrodes (322) are floating electrodes not directly connected to the power supply unit (310), and are connected electrically to the exposed cathode electrode (324) by generating plasmas within cell regions.

In the forth process step thereof, a silicon nitride layer functioning as an insulating layer is deposited at temperatures below 130° C. by a PECVD (plasma enhanced chemical vapor deposition) method on the anode layer of electroluminescent devices (320) including the electroluminescent layers (314) and exposed anode electrodes (322). And, in the fifth process step thereof, a second Al layer is deposited on the silicon nitride layer at a thickness of 1000 Å by e-beam evaporation, thereby forming the exposed cathode electrode (324). Furthermore, portions of the exposed cathode electrode (324) and silicon nitride layer corresponding to the middle part of each of cells are etched by photolithography, thereby forming a plurality of the exposing openings (318) exposing the corresponding portions of the exposed anode electrodes (322). The exposed areas of the exposed anode electrodes (322), which are exposed by the corresponding exposing openings (318), are smaller than those of the exposed cathode electrode (324).

Figure 13:
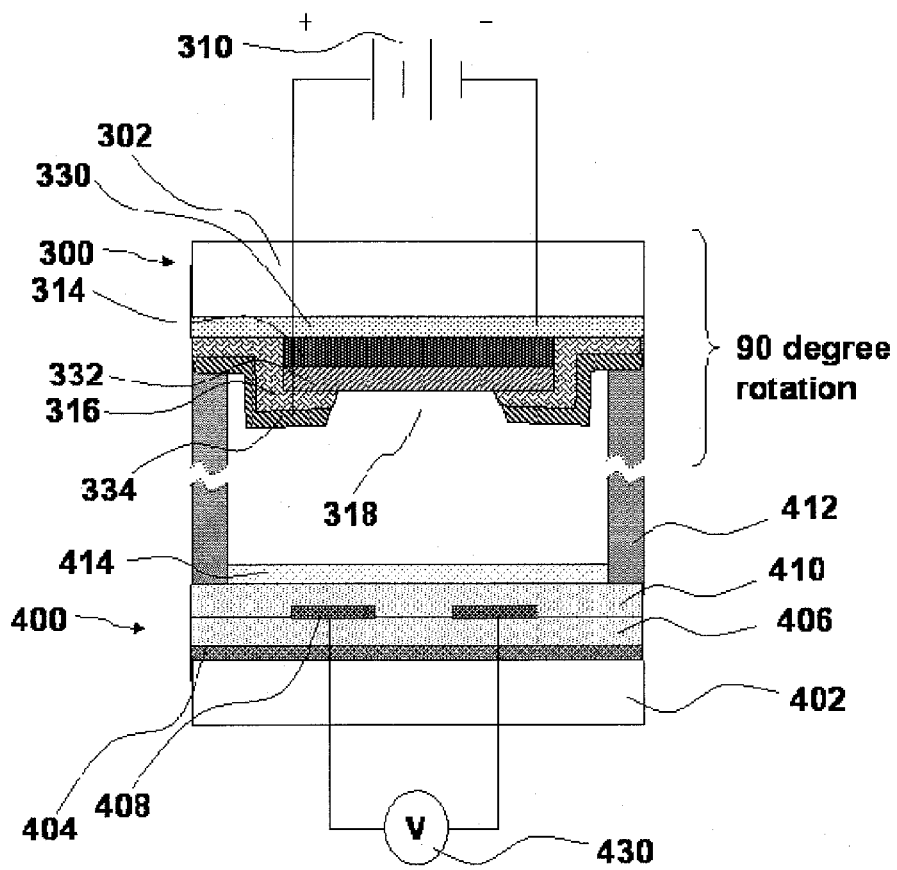
FIG. 13 schematically illustrates a cross-sectional view of a microplasma current switch according to a fifth embodiment of the present invention.

FIG. 13 schematically illustrates a cross-sectional view of a microplasma current switch according to a fifth preferred embodiment of the present invention. FIG. 13 shows only one cell of a display device using the microplasma current switch, wherein the upper plate (300) is rotated clockwise by 90 degrees with respect to the lower plate (400) for the convenience of understanding.

The microplasma current switch according to the fifth embodiment of the present invention includes an upper plate (300) and a lower plate (400). The lower plate (400) includes a rear substrate (402), address electrodes (404) on the rear substrate (402), a first dielectric layer (406) on the rear substrate (402) including the address electrodes (404), sustain electrodes (408) on the first dielectric layer (406), a second dielectric layer (410) on the first dielectric layer (406) including the sustain electrodes (408), barrier ribs (412) on the second dielectric layer (410), and protective layers (414) on the exposed surface of the second dielectric layer (410) between the barrier ribs (412).

And, the upper plate (300) confronting the lower plate (400) includes a front substrate (302), a cathode layer of electroluminescent devices (330) on the front substrate (302), electroluminescent layers (314) on the cathode layer of electroluminescent devices (330), exposed cathode electrodes (332), which are used as anode layers of the electroluminescent devices, formed on the electroluminescent layers (314), an insulating layer (316) on the cathode layer of electroluminescent devices (330) including the electroluminescent layers (314) and exposed cathode electrodes (332), an exposed anode electrode (334) on the insulating layer (316), and exposing openings (318) formed by removing portions of the insulating layer (316) and exposed anode electrode (334) so as to expose portions of the exposed cathode electrodes (332).

And, a power supply unit (310) is installed between the exposed anode electrode (334) and cathode layer of electroluminescent devices (330), and a cathode and anode of the power supply unit (310) are connected to the cathode layer of electroluminescent devices (330) and exposed anode electrode (334), respectively. On the front substrate (302), the exposed areas of the exposed cathode electrodes (332), which are exposed by the exposing openings (318), are larger than those of the exposed anode electrode (334) within cell regions, whereby the operation voltage and power consumption are decreased when the exposed cathode electrode and exposed anode electrodes (332) and (334) are connected electrically by plasmas. And, the exposed areas of the exposed cathode electrodes (332) can also be identical to those of the exposed anode electrode (334). Furthermore, since the aperture ratio of the electroluminescent devices is increased, the operation voltage and power consumption are decreased as well as the life time is increased.

Even though the process steps of fabricating the microplasma current switch including the upper and lower plates (300) and (400) according to the fifth embodiment of the present invention are not illustrated in the drawing, the microplasma current switch is fabricated by the following process steps. Since the process Steps of fabricating the lower plate (400) and assembling the upper and lower plates (300) and (400) of the fifth embodiment of the present invention are identical to those of the first embodiment of the present invention, the explanation thereof is omitted.

In the first process step of fabricating the upper plate (300), a first ITO (indium tin oxide) layer is deposited on an entire surface of the front substrate (302) at a thickness of about 1000 Å by a sputtering method, and an Al (aluminum) layer is deposited on the first ITO layer at a thickness of 30 Å to 50 Å, thereby forming the cathode layer of electroluminescent devices (330). In this case, the Al layer on the first ITO layer is needed to reduce the work function difference between the first ITO layer and an electron transport layer formed later.

In the second process step thereof, formed in order by thermal evaporation using shadow masks are a plurality of electron transport layers on the cathode layer of electroluminescent devices (330), a plurality of the electroluminescent layers (314) on the electron transport layers, a plurality of hole transport layers on the electroluminescent layers (314), and a plurality of hole injection layers on the hole transport layers. When the electroluminescent layers (314) are formed of high-molecular organic materials, formed in order by inkjet printing are a plurality of the electroluminescent layers (314) on the cathode layer of electroluminescent devices (330), and a plurality of hole transport layers on the electroluminescent layers (314).

In the third process step thereof, a second ITO layer is deposited at a thickness of 500 Å on the hole injection layers at temperatures below 130° C. by a sputtering method using a shadow mask, and a Cr (chrome) layer is deposited at a thickness of 1000 Å on the second ITO layer, thereby forming a plurality of the exposed cathode electrodes (332) composed of the second ITO and Cr layers. And, the exposed cathode electrodes (332) are floating electrodes not directly connected to the power supply unit (310), and are connected electrically to the exposed anode electrode (334) by generating plasmas within cell regions.

In the forth process step thereof, a silicon nitride layer functioning as an insulating layer is deposited at temperatures below 130° C. by a PECVD (plasma enhanced chemical vapor deposition) method on the cathode layer of electroluminescent devices (330) including the electroluminescent layers (314) and exposed cathode electrodes (332). And, in the fifth process step thereof, an Al (aluminum) layer is deposited on the silicon nitride layer at a thickness of 1000 Å by e-beam evaporation, thereby forming the exposed anode electrode (334). Furthermore, portions of the exposed anode electrode (334) and silicon nitride layer corresponding to the middle part of each of cells are etched by photolithography, thereby forming a plurality of the exposing openings (318) exposing the corresponding portions of the exposed cathode electrodes (332). The exposed areas of the exposed cathode electrodes (332), which are exposed by the corresponding exposing openings (318), are larger than those of the exposed anode electrode (334).

Explained in the following are effects of the microplasma current switch in accordance with the present invention and the fabrication method thereof.

As mentioned in the above description, the present invention enables to increase the amount of saturation current as well as electric current, thereby decreasing the power consumption as well as operation voltage by providing a microplasma current switch, in which the exposed anode electrode and exposed cathode electrode have different areas exposed to plasmas from each other. Moreover, the present invention enables to increase the area of an electrical device, thereby decreasing the power consumption as well as operation voltage by providing a microplasma current switch of a new structure, in which an insulating layer is formed between the exposed electrodes so as to maximize the area of the electrical device within a cell region.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

The invention claimed is:

1. A microplasma current switch comprising:
   a plasma discharge space defined by a front substrate and a rear substrate along with barrier ribs partitioning a cell region;
   an exposed cathode electrode installed on the front substrate;
   an exposed anode electrode installed on the front substrate apart from the exposed cathode electrode; and
   a plurality of address electrodes installed on the rear substrate in parallel with each other; and a plurality of sustain electrodes constructing a plurality of sustain electrode pairs, wherein the sustain electrodes are insulated from the address electrodes and cross the address electrodes at right angles;
   wherein the exposed anode electrode is connected electrically to the exposed cathode electrode by generating a plasma, and an exposed area of the exposed anode electrode to the plasma is smaller than that of the exposed cathode electrode.

2. The microplasma current switch of claim 1, further comprising an electrical device connected to the exposed cathode electrode; and a power supply unit installed between the electrical device and the exposed anode electrode, wherein the electrical device contributes to a display.

3. The microplasma current switch of claim 2, wherein the electrical device further includes
 a cathode layer of the electrical device connected to a cathode of the power supply unit;
 an electroluminescent device connected to the cathode layer of the electrical device; and the exposed cathode electrode connected to the electroluminescent device,
 wherein the exposed cathode is used as an anode layer of the electrical device.

4. The microplasma current switch of claim 2, wherein the electrical device further includes a cathode layer of the electroluminescent device on the front substrate; an electroluminescent layer on the cathode layer of the electroluminescent device; and an anode layer of the electroluminescent device on the electroluminescent layer, wherein the anode layer of the electroluminescent device is used as the exposed cathode electrode, and the exposed anode electrode is formed on the front substrate apart from the exposed cathode electrode.

5. The microplasma current switch of any one of claims 2 to 4, wherein the electrical device is an organic electroluminescent device.

6. A microplasma current switch comprising:
 a plurality of plasma discharge spaces defined by a front substrate and a rear substrate along with a plurality of barrier ribs partitioning a plurality of cell regions;
 a plurality of designation means, which have display information, selecting the plasma discharge spaces;
 a plurality of exposed cathode electrodes installed on the front substrate of the respective plasma discharge spaces; and
 a plurality of exposed anode electrodes installed on the front substrate of the respective plasma discharge spaces apart from the corresponding exposed cathode electrodes,
 wherein the exposed anode electrodes are connected electrically to the corresponding exposed cathode electrodes by generating plasmas and exposed areas of the exposed anode electrodes to the plasmas are smaller than those of the exposed cathode electrodes; and
 wherein the designation means further include a plurality of address electrodes installed on the rear substrate in parallel with each other; and a plurality of sustain electrodes constructing a plurality of sustain electrode pairs, wherein the sustain electrodes are insulated from the address electrodes and cross the address electrodes at right angles.

7. The microplasma current switch of claim 6, wherein a plurality of electrical devices are installed within the respective cell regions, wherein each of the electrical devices includes a cathode layer of an electroluminescent device on the front substrate; an electroluminescent layer on the cathode layer of the electroluminescent device; and an anode layer of the electroluminescent device on the electroluminescent layer, wherein the anode layer of the electroluminescent device is used as the exposed cathode electrode, and the exposed anode electrodes are formed on the front substrate apart from the corresponding exposed cathode electrodes.

8. A microplasma current switch comprising:
 a plasma discharge space defined by a front substrate and a rear substrate along with barrier ribs partitioning a cell region;
 a first exposed electrode installed on the front substrate of the plasma discharge space;
 an insulating layer installed on the first exposed electrode exposing a portion of the first exposed electrode at a first area;
 a second exposed electrode installed on the insulating layer and exposed at a second area; and
 a plurality of address electrodes installed on the rear substrate in parallel with each other; and a plurality of sustain electrodes constructing a plurality of sustain electrode pairs, wherein the sustain electrodes are insulated from the address electrodes and cross the address electrodes at right angles;
 wherein the second exposed electrode is connected electrically to the first exposed electrode by generating a plasma, and wherein the second exposed electrode is exposed at the second area larger than the first area.

9. The microplasma current switch of claim 8, further comprising an electrical device connected to the first exposed electrode; and a power supply unit installed between the electrical device and the second exposed electrode, wherein the electrical device contributes to a display.

10. The microplasma current switch of claim 9, wherein the electrical device further includes an anode layer of the electrical device connected to an anode of the power supply unit; an electroluminescent device connected to the anode layer of the electrical device; and the first exposed electrode connected to the electroluminescent device, wherein the first exposed electrode is used as a cathode layer of the electrical device.

11. The microplasma current switch of claim 9, wherein the plasma discharge space is defined by assembling a front substrate and a rear substrate along with barrier ribs partitioning a cell region, and the electrical device further includes an anode layer of the electroluminescent device on the front substrate; an electroluminescent layer on the anode layer of the electroluminescent device; a cathode layer of the electroluminescent device on the electroluminescent layer; the insulating layer formed on the anode layer of the electroluminescent device including the electroluminescent layer and the cathode layer of the electroluminescent device so as to expose a portion of the cathode layer of the electroluminescent device at the first area; and the second exposed electrode formed on the insulating layer, wherein the second exposed electrode is exposed at the second area larger than the first area, and the cathode layer of the electroluminescent device is used as the first exposed electrode.

12. The microplasma current switch of claim 9, wherein the plasma discharge space is defined by assembling a front substrate and a rear substrate along with barrier ribs partitioning a cell region, and the electrical device further includes a cathode layer of the electroluminescent device on the front substrate; an electroluminescent layer on the cathode layer of the electroluminescent device; an anode layer of the electroluminescent device on the electroluminescent layer; the insulating layer formed on the cathode layer of the electroluminescent device including the electroluminescent layer and the anode layer of the electroluminescent device so as to expose a portion of the anode layer of the electroluminescent device at the first area; and the second exposed electrode formed on the insulating layer, wherein the second exposed electrode is exposed at the second area smaller than the first area, and the anode layer of the electroluminescent device is used as the first exposed electrode.

* * * * *